United States Patent
Chen et al.

(10) Patent No.: US 12,155,385 B2
(45) Date of Patent: Nov. 26, 2024

(54) MOTOR CONTROLLER HAVING PULSE WIDTH MODULATION GENERATING MECHANISM

(71) Applicant: ANPEC ELECTRONICS CORPORATION, Hsinchu (TW)

(72) Inventors: Li-Wei Chen, Hsinchu (TW); Ke-Tsung Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 150 days.

(21) Appl. No.: 18/113,143

(22) Filed: Feb. 23, 2023

(65) Prior Publication Data

US 2024/0195393 A1    Jun. 13, 2024

(30) Foreign Application Priority Data

Dec. 12, 2022 (TW) ................... 111147522

(51) Int. Cl.
*H02P 27/04* (2016.01)
*H02P 29/00* (2016.01)
*H03K 3/017* (2006.01)
*H03K 4/06* (2006.01)

(52) U.S. Cl.
CPC ............. *H03K 3/017* (2013.01); *H02P 29/00* (2013.01); *H03K 4/06* (2013.01)

(58) Field of Classification Search
CPC .......... H03K 3/017; H03K 4/06; H02P 29/00; H02P 27/08; H02P 6/08; H02P 7/29; H02P 29/0241

See application file for complete search history.

(56) References Cited

U.S. PATENT DOCUMENTS

| 8,098,033 B2 | 1/2012 | Imai |
| 2008/0246523 A1 | 10/2008 | Murakami et al. |
| 2011/0221541 A1* | 9/2011 | Ueda .................. H03K 5/1252 332/109 |
| 2014/0084823 A1 | 3/2014 | Lee |

* cited by examiner

*Primary Examiner* — Karen Masih
(74) *Attorney, Agent, or Firm* — Li & Cai Intellectual Property (USA) Office

(57) ABSTRACT

A motor controller having a pulse width modulation generating mechanism is provided. A triangular wave signal generator circuit generates a triangular wave signal. A comparator compares the triangular wave signal with an input control signal to determine a pulse width modulation signal. A signal detector circuit detects a duty cycle of each of a plurality of pulse waves of the pulse width modulation signal. A control converter circuit converts the duty cycle of each of the plurality of pulse waves of the pulse width modulation signal as an arithmetic value into a control value, according to a preset ratio. A driver circuit drives a motor to rotate according to the control value from the control converter circuit.

8 Claims, 7 Drawing Sheets

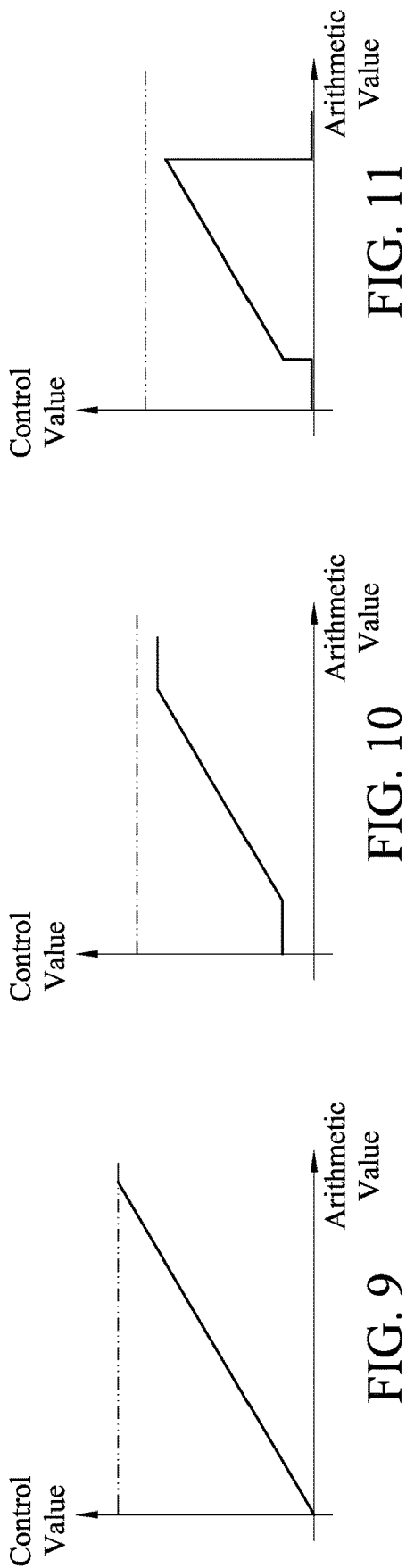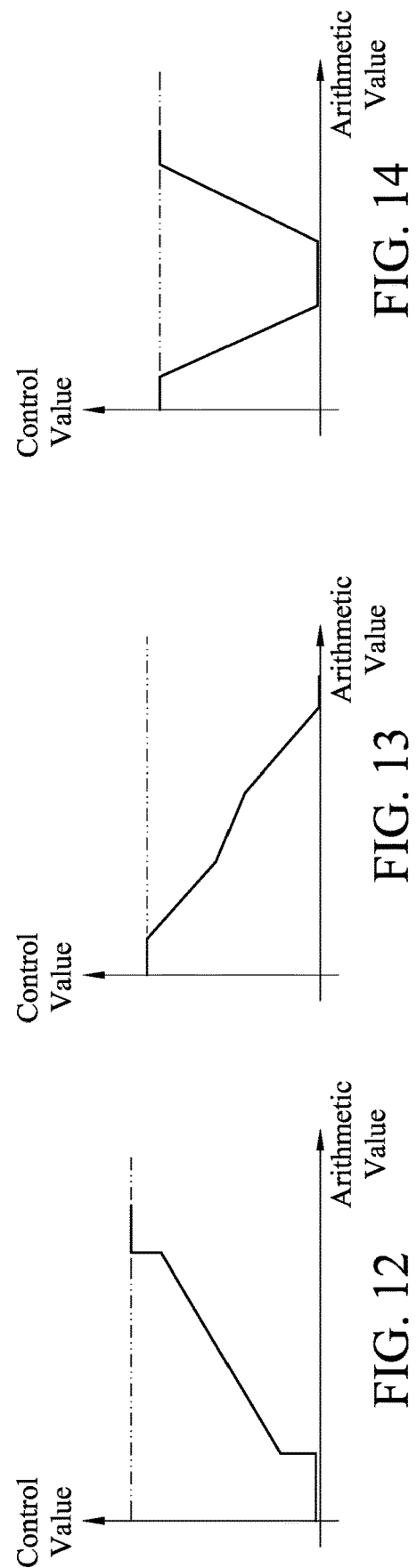

MOTOR CONTROLLER HAVING PULSE WIDTH MODULATION GENERATING MECHANISM

CROSS-REFERENCE TO RELATED PATENT APPLICATION

This application claims the benefit of priority to Taiwan Patent Application No. 111147522, filed on Dec. 12, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a motor, and more particularly to a motor controller having a pulse width modulation generating mechanism.

BACKGROUND OF THE DISCLOSURE

Conventional motor controllers include analog-digital converters used for converting analog signals into digital signals. Driver circuits decode logic values of the digital signals to obtain digital control commands, and drive motors to rotate according to the digital control commands.

However, the analog-to-digital converters that are disposed for operation of the motors occupy large areas in the conventional motor controllers, so that costs of the conventional motor controllers are increased. After the conventional motor controllers convert the analog signals into the digital signals, additional precision circuits must be used to decode the digital signal. Therefore, more resources are required for controlling the operation of the motors by the conventional motor controllers, which causes increase in power consumption of the conventional motor controllers.

SUMMARY OF THE DISCLOSURE

In response to the above-referenced technical inadequacies, the present disclosure provides a motor controller having a pulse width modulation generating mechanism. The motor controller includes a triangular wave signal generator circuit, a comparing circuit, a signal detector circuit and a control converter circuit. The triangular wave signal generator circuit is configured to output a triangular wave signal. The comparing circuit is connected to the triangular wave signal generator circuit. The comparing circuit compares a plurality of voltages of the triangular wave signal from the triangular wave signal generator circuit with a voltage of an input control signal to determine a plurality of voltage levels of a plurality of pulse waves of a pulse width modulation signal, so as to determine duty cycles of the plurality of pulse waves of the pulse width modulation signal. The comparing circuit outputs the pulse width modulation signal. The signal detector circuit is connected to the comparing circuit. The signal detector circuit is configured to detect a duty cycle of each of the plurality of pulse waves of the pulse width modulation signal to output a duty cycle detected signal. The control converter circuit is connected to the signal detector circuit and a driver circuit of a motor. The control converter circuit converts the duty cycle of each of the plurality of pulse waves of the pulse width modulation signal that is indicated by the duty cycle detected signal as an arithmetic value into a control value according to a preset ratio. The control converter circuit outputs the control value to the driver circuit connected to the motor. The driver circuit drives the motor to rotate according to the control value from the control converter circuit.

In certain embodiments, the signal detector circuit receives a pulse width modulation input signal from an external preset control circuit connected thereto. The signal detector circuit selects one of the pulse width modulation input signal and the pulse width modulation signal to output the duty cycle detected signal. The signal detector circuit detects the duty cycles of the one of the pulse width modulation input signal and the pulse width modulation signal to output the duty cycle detected signal.

In certain embodiments, the comparing circuit includes a triangular wave comparing circuit and a multiplexer. The triangular wave comparing circuit is connected to the triangular wave signal generator circuit. The triangular wave comparing circuit is configured to compare the triangular wave signal from the triangular wave signal generator circuit with the input control signal to output the pulse width modulation signal. A first input terminal of the multiplexer is connected to the triangular wave comparing circuit, and receives the pulse width modulation signal from the triangular wave comparing circuit. A second input terminal of the multiplexer is connected to an external preset control circuit, and receives a pulse width modulation input signal from the external preset control circuit. An output terminal of the multiplexer is connected to the signal detector circuit. The multiplexer selects to output one of the pulse width modulation signal and the pulse width modulation input signal to the signal detector circuit. The signal detector circuit detects the duty cycles of the one of the pulse width modulation input signal and the pulse width modulation signal to output the duty cycle detected signal.

In certain embodiments, a control terminal of the multiplexer receives a mode selecting signal from an external mode selector circuit connected thereto. The multiplexer selects to output one of the pulse width modulation signal and the pulse width modulation input signal to the signal detector circuit according to the mode selecting signal.

In certain embodiments, the triangular wave signal generator circuit sequentially constructs a plurality of rising triangular wave segments of the triangular wave signal. When the triangular wave signal generator circuit determines that a voltage of each of the plurality of rising triangular wave segments is constructed to gradually rise from a valley value to reach a preset upper limit voltage, the triangular wave signal generator circuit determines that each of the plurality of rising triangular wave segments of the triangular wave signal is completed. The triangular wave signal generator circuit uses a time point at which each of the plurality of rising triangular wave segments of the triangular wave signal is completed as a voltage transition time point of the triangular wave signal.

In certain embodiments, the triangular wave signal generator circuit sequentially constructs a plurality of falling triangular wave segments of the triangular wave signal. When the triangular wave signal generator circuit determines that a voltage of each of the plurality of falling triangular wave segments is constructed to gradually fall from a peak value to reach a preset lower limit voltage, the triangular wave signal generator circuit determines that each of the plurality of falling triangular wave segments of the triangular wave signal is completed. The triangular wave signal generator circuit uses a time point at which each of the plurality of falling triangular wave segments of the triangular wave signal is completed as a voltage transition time point of the triangular wave signal.

In certain embodiments, the triangular wave signal generator circuit includes a triangular wave signal generator, a triangular wave upper limit determining circuit and a triangular wave lower limit determining circuit. The triangular wave signal generator gradually pulls up a voltage of each of a plurality of rising triangular wave segments of the triangular wave signal to gradually construct each of the plurality of rising triangular wave segments of the triangular wave signal. The triangular wave signal generator gradually pulls down a voltage of each of a plurality of falling triangular wave segments of the triangular wave signal to gradually construct each of the plurality of falling triangular wave segments of the triangular wave signal. The triangular wave upper limit determining circuit is connected to the triangular wave signal generator. When the triangular wave upper limit determining circuit determines that the voltage of each of the plurality of rising triangular wave segments is gradually pulled up to reach a preset upper limit voltage, the triangular wave upper limit determining circuit instructs the triangular wave generator to stop pulling up each of the plurality of rising triangular wave segments of the triangular wave signal. The triangular wave lower limit determining circuit is connected to the triangular wave signal generator. When the triangular wave lower limit determining circuit determines that the voltage of each of the plurality of falling triangular wave segments is gradually pulled down to reach a preset lower limit voltage, the triangular wave lower limit determining circuit instructs the triangular wave generator to stop pulling down each of the plurality of falling triangular wave segments of the triangular wave signal.

In certain embodiments, the control converter circuit includes a control value converting circuit and an operation control circuit. The control value converting circuit is connected to the signal detector circuit. The control value converting circuit is configured to convert the duty cycle of each of the plurality of pulse waves of the pulse width modulation signal that is indicated by the duty cycle detected signal into the control value according to the preset ratio. The operation control circuit is connected to the control value converting circuit and the driver circuit of the motor. The operation control circuit outputs a control signal to the driver circuit according to the control value from the control value converting circuit. The driver circuit drives the motor to rotate according to the control signal from the operation control circuit.

As described above, the present disclosure provides the motor controller having the pulse width modulation generating mechanism. The motor controller of the present disclosure is capable of providing the appropriate control values to the driver circuit of the motor without any analog-to-digital converter occupying a large area being disposed in the motor controller of the present disclosure, Such that the driver circuit effectively controls the motor to operate as expected according to the appropriate control values from the motor controller of the present disclosure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 9 is a schematic diagram of duty cycles of a pulse width modulation signal as arithmetic values versus control values converted from the arithmetic values by a motor controller having a pulse width modulation generating mechanism according to a seventh embodiment of the present disclosure;

FIG. 10 is a schematic diagram of duty cycles of a pulse width modulation signal as arithmetic values versus control values converted from the arithmetic values by a motor controller having a pulse width modulation generating mechanism according to an eighth embodiment of the present disclosure;

FIG. 11 is a schematic diagram of duty cycles of a pulse width modulation signal as arithmetic values versus control values converted from the arithmetic values by a motor controller having a pulse width modulation generating mechanism according to a ninth embodiment of the present disclosure;

FIG. 12 is a schematic diagram of duty cycles of a pulse width modulation signal as arithmetic values versus control values converted from the arithmetic values by a motor controller having a pulse width modulation generating mechanism according to a tenth embodiment of the present disclosure;

FIG. 13 is a schematic diagram of duty cycles of a pulse width modulation signal as arithmetic values versus control values converted from the arithmetic values by a motor controller having a pulse width modulation generating mechanism according to an eleventh embodiment of the present disclosure; and FIG. 14 is a schematic diagram of duty cycles of a pulse width modulation signal as arithmetic values versus control values converted from the arithmetic values by a motor controller having a pulse width modulation generating mechanism according to a twelfth embodiment of the present disclosure.

DETAILED DESCRIPTION OF THE EXEMPLARY EMBODIMENTS

Figure 1:
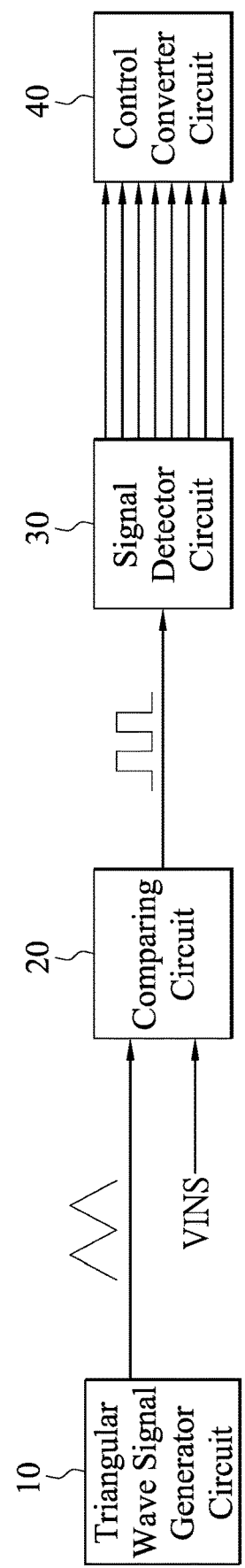
FIG. 1 is a block diagram of a motor controller having a pulse width modulation generating mechanism according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
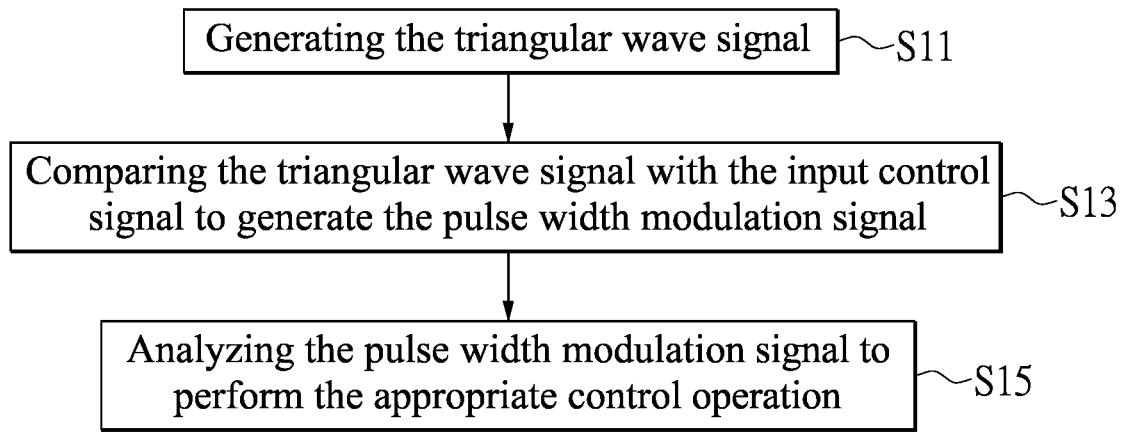
FIG. 2 is a flowchart diagram of the motor controller having the pulse width modulation generating mechanism according to the first embodiment of the present disclosure.

Reference is made to FIGS. 1 and 2, in which FIG. 1 is a block diagram of a motor controller having a pulse width modulation generating mechanism according to a first embodiment of the present disclosure, and FIG. 2 is a flowchart diagram of the motor controller having the pulse width modulation generating mechanism according to the first embodiment of the present disclosure.

The motor controller of the first embodiment of the present disclosure includes a triangular wave signal generator circuit 10, a comparing circuit 20, a signal detector circuit 30 and a control converter circuit 40. The comparing circuit 20 is connected to the triangular wave signal generator circuit 10 and the signal detector circuit 30. The signal detector circuit 30 is connected to the control converter circuit 40. The control converter circuit 40 is connected to a driver circuit of a motor.

The motor controller of the first embodiment of the present disclosure as shown in FIG. 1 may perform steps S11 to S15 as shown in FIG. 2.

The triangular wave signal generator circuit 10 generates a triangular wave signal (in step S11).

The comparing circuit 20 receives the triangular wave signal from the triangular wave signal generator circuit 10. In addition, the comparing circuit 20 may receive an input control signal VINS from an external preset control circuit connected thereto.

The comparing circuit 20 compares a plurality of voltages of a plurality of triangular waveforms of the triangular wave signal with a voltage of the input control signal VINS or a plurality of voltages on a plurality of waveforms of the input control signal VINS to determine a plurality of voltage levels of a plurality of pulse waves of a pulse width modulation signal, so as to determine a plurality of duty cycles of the plurality of pulse waves of the pulse width modulation signal (in step S13). The comparing circuit 20 outputs the pulse width modulation signal (in step S13).

The signal detector circuit 30 detects the duty cycle of each of the plurality of pulse waves of the pulse width modulation signal (in step S15). The signal detector circuit 30, according to the detected duty cycle of each of the plurality of pulse waves of the pulse width modulation signal, outputs a duty cycle detected signal or a plurality of duty cycle detected signals (in step S15) as shown in FIG. 1.

The control converter circuit 40, according to a preset ratio, converts one or more of the plurality of duty cycles of the plurality of pulse waves of the pulse width modulation signal that is indicated by the duty cycle detected signal from the signal detector circuit 30 as arithmetic values into values. The control converter circuit 40 defines the converted values as control values. The control converter circuit 40 outputs the control values or outputs a control signal or a control command according to the control values to the driver circuit of the motor (in step S15). The driver circuit controls the motor to rotate according to the control values, the control signal or the control command from the control converter circuit 40.

Figure 3:
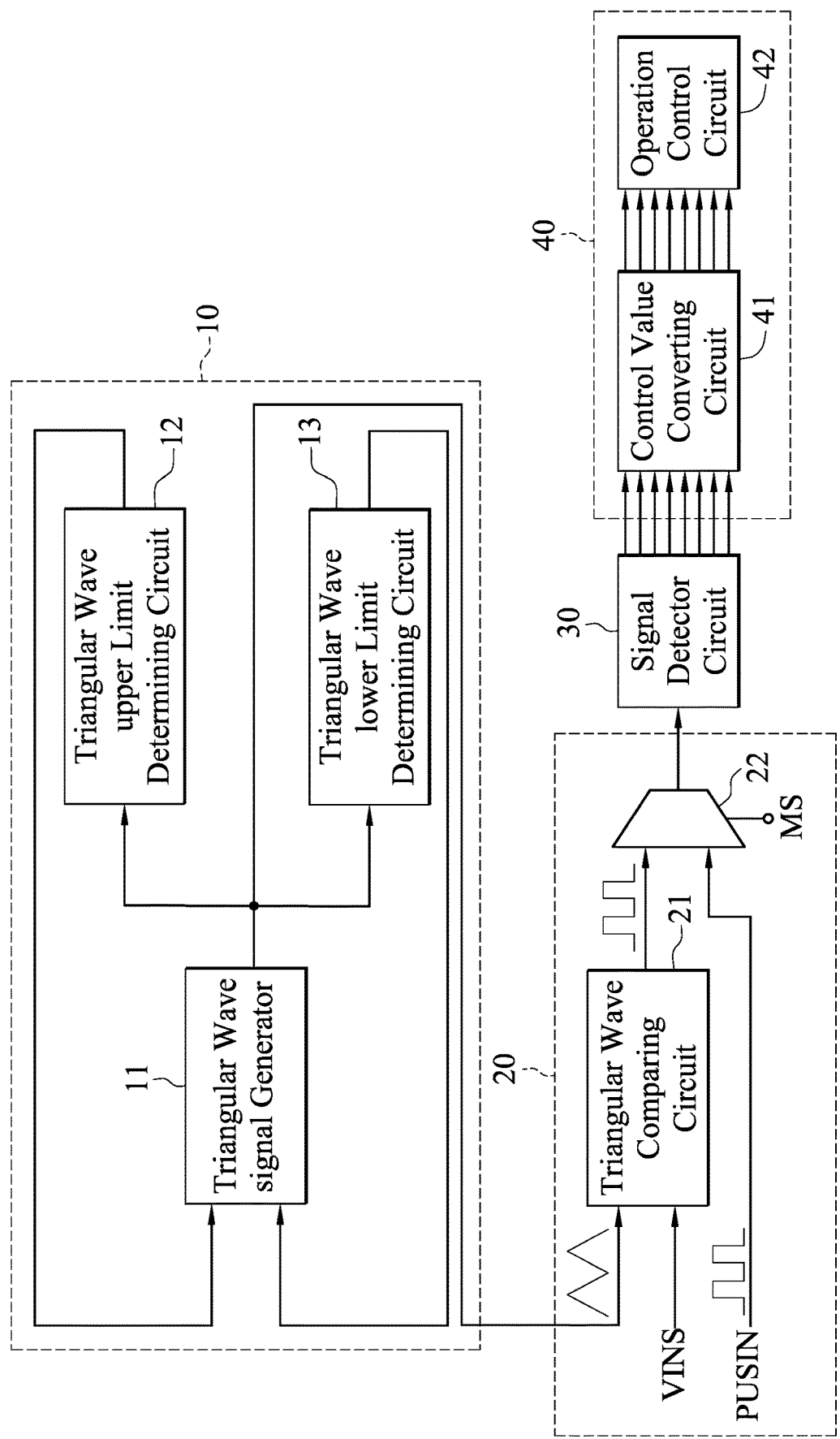
FIG. 3 is a block diagram of a motor controller having a pulse width modulation generating mechanism according to a second embodiment of the present disclosure.
Figure 4:
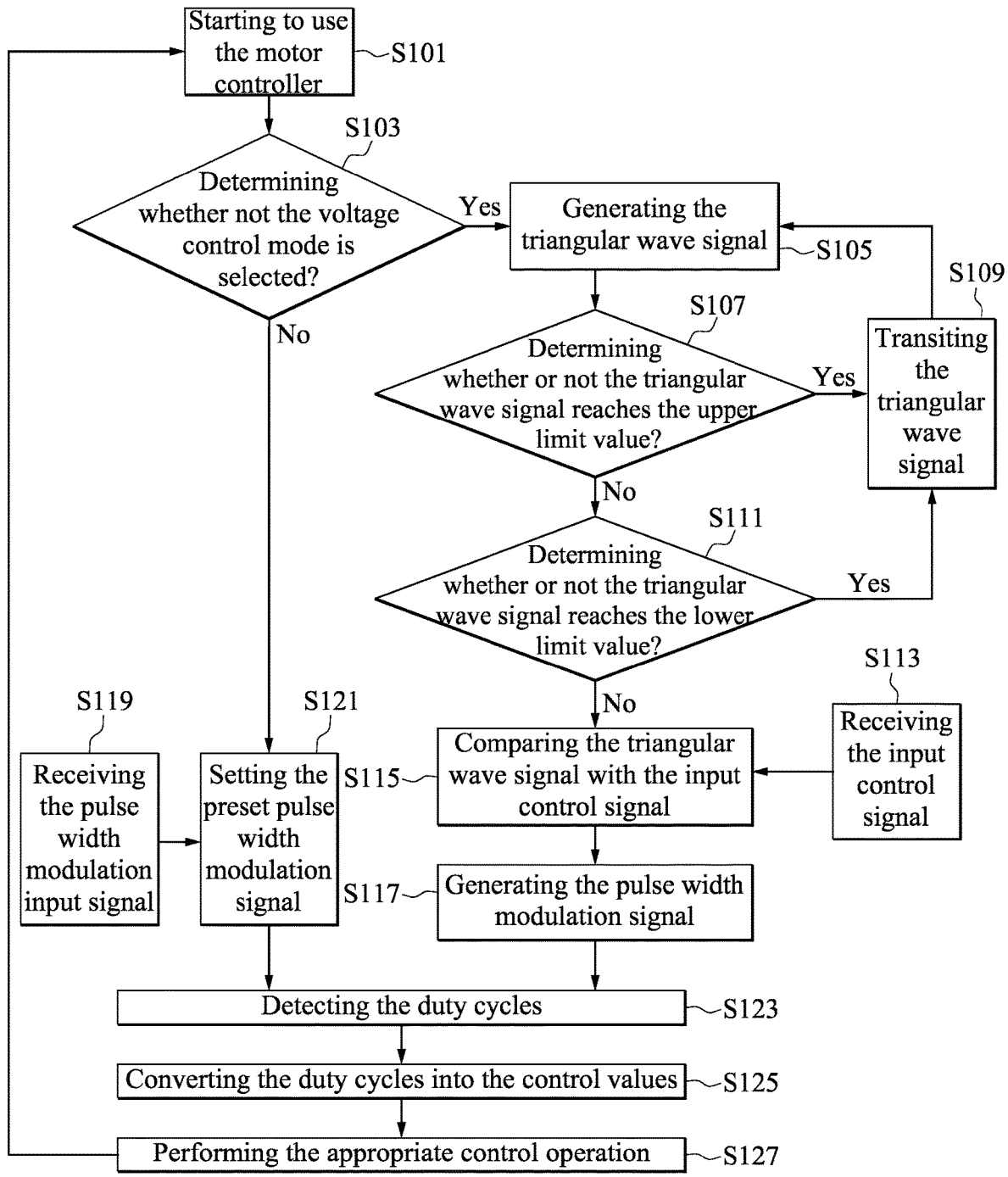
FIG. 4 is a flowchart diagram of the motor controller having the pulse width modulation generating mechanism according to the second embodiment of the present disclosure.

Reference is made to FIGS. 3 and 4, in which FIG. 3 is a block diagram of a motor controller having a pulse width modulation generating mechanism according to a second embodiment of the present disclosure, and FIG. 4 is a flowchart diagram of the motor controller having the pulse width modulation generating mechanism according to the second embodiment of the present disclosure.

As shown in FIG. 3, the motor controller of the second embodiment of the present disclosure includes the triangular wave signal generator circuit 10, the comparing circuit 20, the signal detector circuit 30 and the control converter circuit 40. The comparing circuit 20 is connected to the triangular wave signal generator circuit 10 and the signal detector circuit 30. The signal detector circuit 30 is connected to the control converter circuit 40. The control converter circuit 40 is connected to the driver circuit of the motor.

As shown in FIG. 3, in the second embodiment of the present disclosure, the triangular wave signal generator circuit 10 may include a triangular wave signal generator 11, a triangular wave upper limit determining circuit 12 and a triangular wave lower limit determining circuit 13. The comparing circuit 20 may include a triangular wave comparing circuit 21 and a multiplexer 22, and the control converter circuit 40 may include a control value converting circuit 41 and an operation control circuit 42.

In the triangular wave signal generator circuit 10, the triangular wave signal generator 11 is connected to the triangular wave upper limit determining circuit 12 and the triangular wave lower limit determining circuit 13. An output terminal of the triangular wave signal generator 11 of the triangular wave signal generator circuit 10 is connected to an input terminal of the triangular wave comparing circuit 21 of the comparing circuit 20.

A first input terminal of the multiplexer 22 of the comparing circuit 20 is connected to an output terminal of the triangular wave comparing circuit 21 of the comparing circuit 20. A second input terminal of the multiplexer 22 may be connected to the external preset control circuit. An output terminal of the multiplexer 22 of the comparing circuit 20 is connected to an input terminal of the signal detector circuit 30. A control terminal of the multiplexer 22 may be connected to an external mode selector circuit.

An output terminal of the signal detector circuit 30 is connected to an input terminal of the control value converting circuit 41 of the control converter circuit 40. In the control converter circuit 40, an output terminal of the control value converting circuit 41 is connected to an input terminal of the operation control circuit 42. An output terminal of the operation control circuit 42 may be connected to the driver circuit of the motor.

The motor controller of the second embodiment of the present disclosure as shown in FIG. 3 may perform steps S101 to S127 as shown in FIG. 4, but the present disclosure is not limited thereto. In practice, the motor controller of the present disclosure may only perform some of steps S101 to S127 as shown in FIG. 4, for example, may only perform steps S101 to S117 and steps S123 to S127.

The external mode selector circuit may determine whether or not the motor controller of the second embodiment of the present disclosure enters a voltage control mode (in step S101 to S103) or a preset input control mode.

If the external mode selector circuit determines that the motor controller of the second embodiment of the present disclosure enters the voltage control mode, the external mode selector circuit instructs the motor controller of the second embodiment of the present disclosure to perform steps S105 to S117 and steps S123 to S127.

Conversely, if the external mode selector circuit determines that the motor controller of the second embodiment of the present disclosure does not enter the voltage control mode (and enters the preset input control mode), the external mode selector circuit instructs the motor controller of the second embodiment of the present disclosure to sequentially perform steps S119 to S127.

As shown in FIG. 3, the first input terminal of the multiplexer 22 of the comparing circuit 20 receives the pulse width modulation signal from the triangular wave comparing circuit 21 of the comparing circuit 20. The second input terminal of the multiplexer 22 of the comparing circuit 20 receives a pulse width modulation input signal PUSIN from the external preset control circuit connected thereto.

The control terminal of the multiplexer 22 receives a mode selecting signal MS from the external mode selector circuit. The multiplexer 22, according to the mode selecting signal MS, determines whether or not the motor controller of the second embodiment of the present disclosure enters the voltage control mode (in steps S101 to S103) to select to output which one of the pulse width modulation signal and the pulse width modulation input signal PUSIN to the signal detector circuit 30.

It is worth noting that, in the voltage control mode, the triangular wave signal generator 11 of the triangular wave signal generator circuit 10 gradually constructs a rising triangular wave segment of the triangular wave signal (step S105). When the triangular wave signal generator 11 gradually constructs the rising triangular wave segment of the triangular wave signal, the triangular wave signal generator 11 gradually pulls up a voltage of the rising triangular wave segment of the triangular wave signal. At the same time, the triangular wave signal generator 11 continually outputs the voltage of the rising triangular wave segment of the triangular wave signal to the triangular wave upper limit determining circuit 12 of the triangular wave signal generator circuit 10.

In the voltage control mode, the triangular wave upper limit determining circuit 12 of the triangular wave signal generator circuit 10 continually compares the voltage of each of the plurality of rising triangular wave segments of the triangular wave signal from the triangular wave signal generator 11 with a preset upper limit voltage to instantly determine whether or not the voltage of each of the plurality of rising triangular wave segments of the triangular wave signal is pulled up to reach the preset upper limit voltage (in step S107).

In the voltage control mode, when the triangular wave upper limit determining circuit 12 determines that the voltage of the rising triangular wave segment of the triangular wave signal is pulled up to reach the preset upper limit voltage, the triangular wave upper limit determining circuit 12 outputs a pulling-up stop indication signal to the triangular wave signal generator 11. The triangular wave signal generator 11 stops pulling up the rising triangular wave segment according to the pulling-up stop indication signal. At this time, the triangular wave signal generator 11 determines that construction of the rising triangular wave segment of one of the plurality of triangular waveforms of the triangular wave signal is completed.

In the voltage control mode, when the triangular wave signal generator 11 determines that the construction of the rising triangular wave segment of the one of the plurality of triangular waveforms is completed, transition of a voltage level of the triangular wave signal is performed by the triangular wave signal generator 11 (in step S109). That is, after the triangular wave signal generator 11 stops pulling up the rising triangular wave segment of the one of the plurality of triangular waveform of the triangular wave signal, the triangular wave signal generator 11 starts constructing a falling triangular wave segment of the one of the plurality of triangular waveform of the triangular wave signal.

In the voltage control mode, when the triangular wave signal generator 11 gradually constructs the falling triangular wave segment of the triangular wave signal, the triangular wave signal generator 11 gradually pulls down a voltage of the of falling triangular wave segment of the triangular wave signal. At the same time, the triangular wave signal generator 11 continually outputs the voltage of the falling triangular wave segment of the triangular wave signal to the triangular wave lower limit determining circuit 13 of the triangular wave signal generator circuit 10.

In the voltage control mode, the triangular wave lower limit determining circuit 13 continually compares the voltage of the falling triangular wave segment of the triangular wave signal from the triangular wave signal generator 11 with a preset lower limit voltage to instantly determine whether or not the voltage of the lower triangular wave segment of the triangular wave signal reaches the preset lower limit voltage (in step S111).

In the voltage control mode, when the triangular wave lower limit determining circuit 13 determines that the voltage of the falling triangular wave segment of the triangular wave signal is pulled down to reach the preset upper limit voltage, the triangular wave lower limit determining circuit 13 outputs a pulling-down stop indication signal to the triangular wave signal generator 11. The triangular wave signal generator 11 stops pulling down the falling triangular wave segment according to the pulling-down stop indication signal. At this time, the triangular wave signal generator 11 determines that construction of the falling triangular wave segment of the one of the plurality of triangular waveforms of the triangular wave signal is completed. Then, the transition of the voltage level of the triangular wave signal is performed by the triangular wave signal generator 11 (in step S109).

In the voltage control mode, the triangular wave signal generator circuit 10 sequentially constructs the rising triangular wave segment and the falling triangular wave segment to generate the triangular waveform of the triangular wave signal. The triangular wave signal generator circuit 10 sequentially constructs the plurality of triangular waveforms of the triangular wave signal in the mentioned-above manner. Finally, the triangular wave signal generator 11 of the triangular wave signal generator circuit 10 outputs the triangular wave signal having the plurality of triangular waveforms to the triangular wave comparing circuit 21 of the comparing circuit 20.

In the voltage control mode, the triangular wave comparing circuit 21 of the comparing circuit 20 receives the input control signal VINS from the external preset control circuit (in step S113). The triangular wave comparing circuit 21 compares the plurality of voltages of the triangular wave signal with one or more voltages of the input control signal VINS (in step S115) to determine the voltage levels of the plurality of pulse waves of the pulse width modulation signal, so as to determine the duty cycles of the plurality of pulse waves of the pulse width modulation signal. The comparing circuit 20 outputs the pulse width modulation signal to the multiplexer 22 (in step S117).

In the voltage control mode, the multiplexer 22, according to the mode selecting signal MS, selects to output the pulse width modulation signal among the pulse width modulation signal from the triangular wave comparing circuit 21 of the comparing circuit 20 and the pulse width modulation input signal PUSIN from the external preset control circuit to the signal detector circuit 30.

In the voltage control mode, the signal detector circuit 30 detects the duty cycle of each of the plurality of pulse waves of the pulse width modulation signal from the triangular wave comparing circuit 21 to output the duty cycle detected signal (in step S123).

In the voltage control mode, the control value converting circuit 41 of the control converter circuit 40, according to the preset ratio, converts the duty cycle of each of the plurality of pulse waves of the pulse width modulation signal that is indicated by the duty cycle detected signal from the signal detector circuit 30 into the control value. The operation control circuit 42 of the control converter circuit 40 directly transmits the control value from the control value converting circuit 41 or outputs a control signal or a control command according to the control value to the driver circuit of the motor (in step S125). The driver circuit controls the motor to rotate according to the control value, the control signal or the control command from the control converter circuit 40 (in step S127).

In contrast, in the preset input control mode, the multiplexer 22, according to the mode selecting signal MS, selects to output the pulse width modulation input signal PUSIN among the pulse width modulation signal from the triangular wave comparing circuit 21 and the pulse width modulation input signal PUSIN from the external preset control circuit to the signal detector circuit 30 (in step S121).

The pulse width modulation input signal PUSIN is a preset pulse width modulation signal.

In the preset input control mode, the signal detector circuit 30 detects a duty cycle of each of a plurality of pulse waves of the pulse width modulation input signal PUSIN from the multiplexer 22 (in step S123). The signal detector circuit 30, according to the detected duty cycle of each of the plurality of pulse waves of the pulse width modulation signal, outputs the duty cycle detected signal or the plurality of duty cycle detected signals as shown in FIG. 1.

In the preset input control mode, the control value converting circuit 41 of the control converter circuit 40, according to the preset ratio, converts the duty cycle of each of the plurality of pulse waves of the pulse width modulation signal that is indicated by the duty cycle detected signal from the signal detector circuit 30 into the control value (in step S125). The operation control circuit 42 of the control converter circuit 40 directly transmits the control value from the control value converting circuit 41 or outputs the control signal or the control command according to the control value to the driver circuit of the motor (in step S125). The driver circuit controls the motor to rotate according to the control value, the control signal or the control command from the control converter circuit 40 (in step S127).

Figure 5:
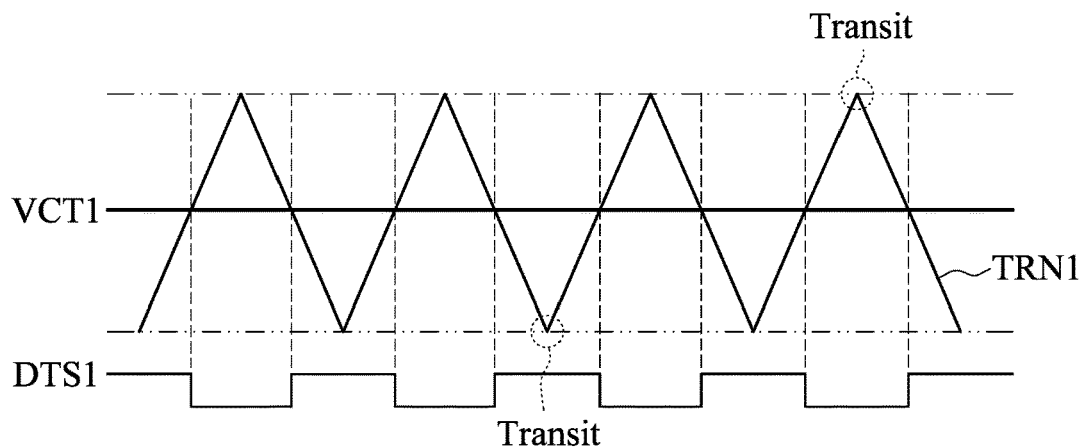
FIG. 5 is a waveform diagram of a triangular wave signal and a pulse width modulation signal that are generated by a motor controller having a pulse width modulation generating mechanism according to a third embodiment of the present disclosure.

Reference is made to FIG. 5, which is a waveform diagram of a triangular wave signal and a pulse width modulation signal that are generated by a motor controller having a pulse width modulation generating mechanism according to a third embodiment of the present disclosure.

The triangular wave signal generator circuit of the motor controller of the present disclosure (such as the triangular wave signal generator circuit 10 as shown in FIG. 1 or the triangular wave signal generator 11 of the triangular wave signal generator circuit 10 as shown in FIG. 3) sequentially constructs the plurality of rising triangular wave segments of the triangular wave signal. For example, the triangular wave signal generator 11 of the motor controller sequentially constructs a plurality of rising triangular wave segments of a triangular wave signal TRN1 as shown in FIG. 5, but the present disclosure is not limited thereto.

When the triangular wave signal generator circuit (such as the triangular wave signal generator circuit 10 as shown in FIG. 1 or the triangular wave upper limit determining circuit 12 of the triangular wave signal generator circuit 10 as shown in FIG. 3) determines that the voltage of the rising triangular wave segment is gradually pulled up from the valley value to reach the preset upper limit voltage, the triangular wave signal generator circuit determines that the construction of the rising triangular wave segment is completed. The triangular wave signal generator circuit uses the time point at which the construction of the rising triangular wave segment of each of the plurality of triangular waveforms of the triangular wave signal is completed as a voltage transition time point of the triangular wave signal as marked by a dotted circle in FIG. 5.

The triangular wave signal generator circuit of the motor controller of the present disclosure (such as the triangular wave signal generator circuit 10 as shown in FIG. 1 or the triangular wave signal generator 11 of the triangular wave signal generator circuit 10 as shown in FIG. 3) sequentially constructs the plurality of falling triangular wave segments of the triangular wave signal, such as, but not limited to the triangular wave signal TRN1 as shown in FIG. 5, but the present disclosure is not limited thereto.

When the triangular wave signal generator circuit (such as the triangular wave signal generator circuit 10 as shown in FIG. 1 or the triangular wave lower limit determining circuit 13 of the triangular wave signal generator circuit 10 as shown in FIG. 3) determines that the voltage of the falling triangular wave segment is gradually pulled down from the peak value to reach the preset lower limit voltage, the triangular wave signal generator circuit determines that the construction of the falling triangular wave segment is completed. The triangular wave signal generator circuit uses the time point at which the construction of the falling triangular wave segment of each of the plurality of triangular waveforms of the triangular wave signal is completed as the voltage transition time point of the triangular wave signal as marked by a dotted circle in FIG. 5.

The triangular wave signal generator circuit sequentially constructs the rising triangular wave segment and the falling triangular wave segment to generate the triangular waveform. The triangular wave signal generator circuit sequentially constructs the plurality of triangular waveforms in the mentioned-above manner. Finally, the triangular wave signal generator 11 of the triangular wave signal generator circuit may output the triangular wave signal TRN1 having the plurality of triangular waveforms as shown in FIG. 5.

The comparing circuit (such as the comparing circuit 20 as shown in FIG. 1 or the triangular wave comparing circuit 21 of the comparing circuit 20 as shown in FIG. 3) compares a plurality of voltage of the triangular wave signal TRN1 with a voltage VCT1 of the input control signal to determine a plurality of voltage levels of a plurality of pulse waves of a pulse width modulation signal DTS1, so as to determine the plurality of duty cycles of the plurality of pulse waves of the pulse width modulation signal DTS1.

Figure 6:
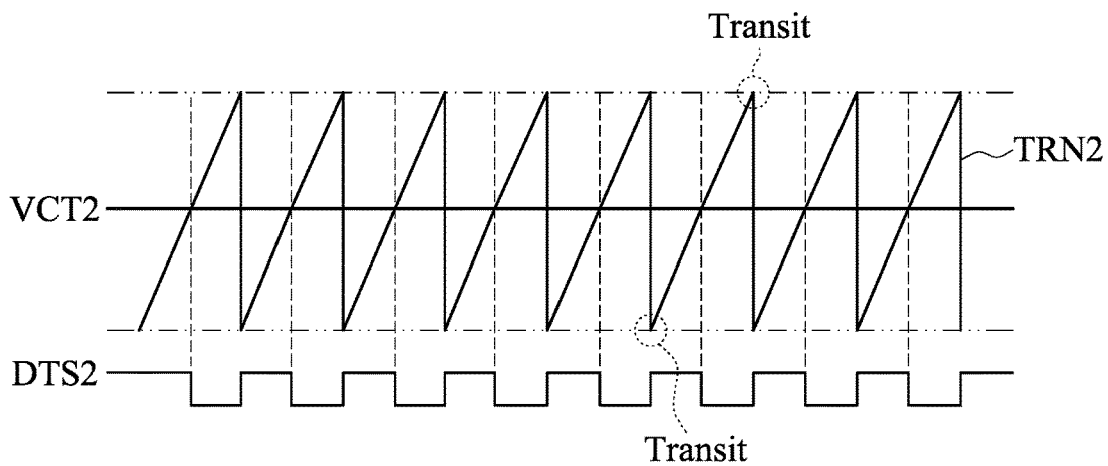
FIG. 6 is a waveform diagram of a triangular wave signal and a pulse width modulation signal that are generated by a motor controller having a pulse width modulation generating mechanism according to a fourth embodiment of the present disclosure.

Reference is made to FIG. 6, which is a waveform diagram of a triangular wave signal and a pulse width modulation signal that are generated by a motor controller having a pulse width modulation generating mechanism according to a fourth embodiment of the present disclosure. The motor controllers of the fourth and third embodiments perform the same operations, the same descriptions of which are not repeated herein.

A difference between the fourth and third embodiments of the present disclosure is that, the motor controller of the fourth embodiment generates a triangular wave signal TRN2 as shown in FIG. 6, receives an input control signal having a voltage VCT2 as shown in FIG. 6, and generates a pulse width modulation signal DTS2 as shown in FIG. 6, but the present disclosure is not limited thereto.

Figure 7:
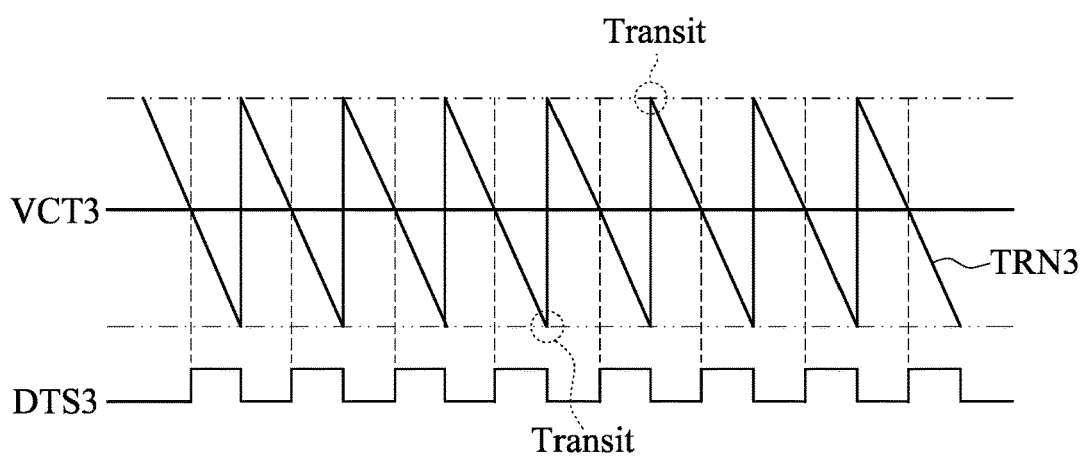
FIG. 7 is a waveform diagram of a triangular wave signal and a pulse width modulation signal that are generated by a motor controller having a pulse width modulation generating mechanism according to a fifth embodiment of the present disclosure.

Reference is made to FIG. 7, which is a waveform diagram of a triangular wave signal and a pulse width modulation signal that are generated by a motor controller having a pulse width modulation generating mechanism according to a fifth embodiment of the present disclosure. The motor controllers of the fifth and third embodiments perform the same operations, the same descriptions of which are not repeated herein.

A difference between the fifth and third embodiments of the present disclosure is that, the motor controller of the fifth embodiment generates a triangular wave signal TRN3 as shown in FIG. 7, receives an input control signal having a voltage VCT3 as shown in FIG. 7, and generates a pulse width modulation signal DTS3 as shown in FIG. 7, but the present disclosure is not limited thereto.

Figure 8:
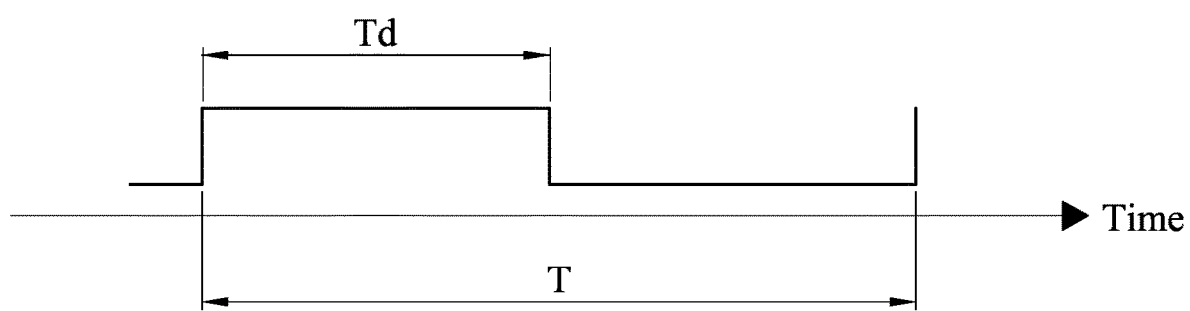
FIG. 8 is a waveform diagram of a duty cycle of a pulse width modulation signal generated by a motor controller having a pulse width modulation generating mechanism according to a sixth embodiment of the present disclosure.

Reference is made to FIG. 8, which is a waveform diagram of a duty cycle of a pulse width modulation signal generated by a motor controller having a pulse width modulation generating mechanism according to a sixth embodiment of the present disclosure.

The duty cycle of the pulse width modulation signal (or the pulse width modulation input signal) that is detected by the signal detector circuit (such as the signal detector circuit 30 as shown in FIG. 1 or FIG. 3) in the motor controller of the present disclosure may be equal to a working period Td divided by an entire period T as shown in FIG. 8.

Reference is made to FIG. 9, which is a schematic diagram of duty cycles of a pulse width modulation signal as arithmetic values versus control values converted from the arithmetic values by a motor controller having a pulse width modulation generating mechanism according to a seventh embodiment of the present disclosure.

The control converter circuit (such as the control converter circuit 40 as shown in FIG. 1 or the control value converting circuit 41 of the control converter circuit 40 as shown in FIG. 3) in the motor controller of the present disclosure may, according to a preset ratio as shown in FIG. 9, convert the duty cycle of each of the plurality of pulse waves of the pulse width modulation signal or the pulse width modulation input signal as the arithmetic value into the control value, but the present disclosure is not limited thereto.

The driver circuit drives the motor to rotate according to the control values from the control converter circuit (such as the control converter circuit 40 as shown in FIG. 1 or the operation control circuit 42 of the control converter circuit 40 as shown in FIG. 3) in the motor controller of the present disclosure.

Reference is made to FIG. 10, which is a schematic diagram of duty cycles of a pulse width modulation signal as arithmetic values versus control values converted from the arithmetic values by a motor controller having a pulse width modulation generating mechanism according to an eighth embodiment of the present disclosure.

The control converter circuit (such as the control converter circuit 40 as shown in FIG. 1 or the control value converting circuit 41 of the control converter circuit 40 as shown in FIG. 3) in the motor controller of the present disclosure may, according to a preset ratio as shown in FIG. 10, convert the duty cycle of each of the plurality of pulse waves of the pulse width modulation signal or the pulse width modulation input signal as the arithmetic value into the control value, but the present disclosure is not limited thereto.

The driver circuit drives the motor to rotate according to the control values from the control converter circuit (such as the control converter circuit 40 as shown in FIG. 1 or the operation control circuit 42 of the control converter circuit 40 as shown in FIG. 3) in the motor controller of the present disclosure.

Reference is made to FIG. 11, which is a schematic diagram of duty cycles of a pulse width modulation signal as arithmetic values versus control values converted from the arithmetic values by a motor controller having a pulse width modulation generating mechanism according to a ninth embodiment of the present disclosure.

The control converter circuit (such as the control converter circuit 40 as shown in FIG. 1 or the control value converting circuit 41 of the control converter circuit 40 as shown in FIG. 3) in the motor controller of the present disclosure may, according to a preset ratio as shown in FIG. 11, convert the duty cycle of each of the plurality of pulse waves of the pulse width modulation signal or the pulse width modulation input signal as the arithmetic value into the control value, but the present disclosure is not limited thereto.

The driver circuit drives the motor to rotate according to the control values from the control converter circuit (such as the control converter circuit 40 as shown in FIG. 1 or the operation control circuit 42 of the control converter circuit 40 as shown in FIG. 3) in the motor controller of the present disclosure.

Reference is made to FIG. 12, which is a schematic diagram of duty cycles of a pulse width modulation signal as arithmetic values versus control values converted from the arithmetic values by a motor controller having a pulse width modulation generating mechanism according to a tenth embodiment of the present disclosure.

The control converter circuit (such as the control converter circuit 40 as shown in FIG. 1 or the control value converting circuit 41 of the control converter circuit 40 as shown in FIG. 3) in the motor controller of the present disclosure may, according to a preset ratio as shown in FIG. 12, convert the duty cycle of each of the plurality of pulse waves of the pulse width modulation signal or the pulse width modulation input signal as the arithmetic value into the control value, but the present disclosure is not limited thereto.

The driver circuit drives the motor to rotate according to the control values from the control converter circuit (such as the control converter circuit 40 as shown in FIG. 1 or the operation control circuit 42 of the control converter circuit 40 as shown in FIG. 3) in the motor controller of the present disclosure.

Reference is made to FIG. 13, which is a schematic diagram of duty cycles of a pulse width modulation signal as arithmetic values versus control values converted from the arithmetic values by a motor controller having a pulse width modulation generating mechanism according to an eleventh embodiment of the present disclosure.

The control converter circuit (such as the control converter circuit 40 as shown in FIG. 1 or the control value converting circuit 41 of the control converter circuit 40 as shown in FIG. 3) in the motor controller of the present disclosure may, according to a preset ratio as shown in FIG. 13, convert the duty cycle of each of the plurality of pulse waves of the pulse width modulation signal or the pulse width modulation input signal as the arithmetic value into the control value, but the present disclosure is not limited thereto.

The driver circuit drives the motor to rotate according to the control values from the control converter circuit (such as the control converter circuit 40 as shown in FIG. 1 or the operation control circuit 42 of the control converter circuit 40 as shown in FIG. 3) in the motor controller of the present disclosure.

Reference is made to FIG. 14, which is a schematic diagram of duty cycles of a pulse width modulation signal as arithmetic values versus control values converted from the arithmetic values by a motor controller having a pulse width modulation generating mechanism according to a twelfth embodiment of the present disclosure.

The control converter circuit (such as the control converter circuit 40 as shown in FIG. 1 or the control value converting circuit 41 of the control converter circuit 40 as shown in FIG. 3) in the motor controller of the present disclosure may, according to a preset ratio as shown in FIG. 14, convert the duty cycle of each of the plurality of pulse waves of the pulse width modulation signal or the pulse width modulation input signal as the arithmetic value into the control value, but the present disclosure is not limited thereto.

The driver circuit drives the motor to rotate according to the control values from the control converter circuit (such as the control converter circuit 40 as shown in FIG. 1 or the operation control circuit 42 of the control converter circuit 40 as shown in FIG. 3) in the motor controller of the present disclosure.

In conclusion, the present disclosure provides the motor controller having the pulse width modulation generating mechanism. The motor controller of the present disclosure provides the appropriate control values to the driver circuit of the motor under the condition that any analog-to-digital converter occupying a large area is not disposed in the motor controller of the present disclosure. The driver circuit effectively controls the motor to operate as expected according to the appropriate control values from the motor controller of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor controller having a pulse width modulation generating mechanism, comprising:
    a triangular wave signal generator circuit configured to output a triangular wave signal;
    a comparing circuit connected to the triangular wave signal generator circuit, wherein the comparing circuit compares a plurality of voltages of the triangular wave signal from the triangular wave signal generator circuit with a voltage of an input control signal to determine a plurality of voltage levels of a plurality of pulse waves of a pulse width modulation signal so as to determine duty cycles of the plurality of pulse waves of the pulse width modulation signal, and the comparing circuit outputs the pulse width modulation signal;
    a signal detector circuit connected to the comparing circuit, and configured to detect a duty cycle of each of the plurality of pulse waves of the pulse width modulation signal to output a duty cycle detected signal; and
    a control converter circuit connected to the signal detector circuit and a driver circuit of a motor, wherein the control converter circuit converts the duty cycle of each of the plurality of pulse waves of the pulse width modulation signal that is indicated by the duty cycle detected signal as an arithmetic value into a control value according to a preset ratio, the control converter circuit outputs the control value to the driver circuit connected to the motor, and the driver circuit drives the motor to rotate according to the control value from the control converter circuit.

2. The motor controller according to claim 1, wherein the signal detector circuit receives a pulse width modulation input signal from an external preset control circuit connected thereto, the signal detector circuit selects one of the pulse width modulation input signal and the pulse width modulation signal, and the signal detector circuit detects the duty cycles of the one of the pulse width modulation input signal and the pulse width modulation signal to output the duty cycle detected signal.

3. The motor controller according to claim 1, wherein the comparing circuit includes:
   a triangular wave comparing circuit connected to the triangular wave signal generator circuit, and configured to compare the triangular wave signal from the triangular wave signal generator circuit with the input control signal to output the pulse width modulation signal; and
   a multiplexer, wherein a first input terminal of the multiplexer is connected to the triangular wave comparing circuit and receives the pulse width modulation signal from the triangular wave comparing circuit, a second input terminal of the multiplexer is connected to an external preset control circuit and receives a pulse width modulation input signal from the external preset control circuit, and an output terminal of the multiplexer is connected to the signal detector circuit;
   wherein the multiplexer chooses to output one of the pulse width modulation signal and the pulse width modulation input signal to the signal detector circuit, and the signal detector circuit detects the duty cycles of the one of the pulse width modulation input signal and the pulse width modulation signal to output the duty cycle detected signal.

4. The motor controller according to claim 3, wherein a control terminal of the multiplexer receives a mode selecting signal from an external mode selector circuit connected thereto, and the multiplexer chooses to output one of the pulse width modulation signal and the pulse width modulation input signal to the signal detector circuit according to the mode selecting signal.

5. The motor controller according to claim 1, wherein the triangular wave signal generator circuit sequentially constructs a plurality of rising triangular wave segments of the triangular wave signal;
   wherein, when the triangular wave signal generator circuit determines that a voltage of each of the plurality of rising triangular wave segments is constructed to gradually rise from a valley value to reach a preset upper limit voltage, the triangular wave signal generator circuit determines that each of the plurality of rising triangular wave segments of the triangular wave signal is completed, and the triangular wave signal generator circuit uses a time point at which each of the plurality of rising triangular wave segments of the triangular wave signal is completed as a voltage transition time point of the triangular wave signal.

6. The motor controller according to claim 1, wherein the triangular wave signal generator circuit sequentially constructs a plurality of falling triangular wave segments of the triangular wave signal;
   wherein, when the triangular wave signal generator circuit determines that a voltage of each of the plurality of falling triangular wave segments is constructed to gradually fall from a peak value to reach a preset lower limit voltage, the triangular wave signal generator circuit determines that each of the plurality of falling triangular wave segments of the triangular wave signal is completed, and the triangular wave signal generator circuit uses a time point at which each of the plurality of falling triangular wave segments of the triangular wave signal is completed as a voltage transition time point of the triangular wave signal.

7. The motor controller according to claim 1, wherein the triangular wave signal generator circuit includes:
   a triangular wave signal generator, wherein the triangular wave signal generator gradually pulls up a voltage of each of a plurality of rising triangular wave segments of the triangular wave signal to gradually construct each of the plurality of rising triangular wave segments of the triangular wave signal, and the triangular wave signal generator gradually pulls down a voltage of each of a plurality of falling triangular wave segments of the triangular wave signal to gradually construct each of the plurality of falling triangular wave segments of the triangular wave signal;
   a triangular wave upper limit determining circuit connected to the triangular wave signal generator, wherein, when the triangular wave upper limit determining circuit determines that the voltage of each of the plurality of rising triangular wave segments is gradually pulled up to reach a preset upper limit voltage, the triangular wave upper limit determining circuit instructs the triangular wave generator to stop pulling up each of the plurality of rising triangular wave segments of the triangular wave signal; and
   a triangular wave lower limit determining circuit connected to the triangular wave signal generator, wherein, when the triangular wave lower limit determining circuit determines that the voltage of each of the plurality of falling triangular wave segments is gradually pulled down to reach a preset lower limit voltage, the triangular wave lower limit determining circuit instructs the triangular wave generator to stop pulling down each of the plurality of falling triangular wave segments of the triangular wave signal.

8. The motor controller according to claim 1, wherein the control converter circuit includes:
   a control value converting circuit connected to the signal detector circuit, and configured to convert the duty cycle of each of the plurality of pulse waves of the pulse width modulation signal that is indicated by the duty cycle detected signal into the control value according to the preset ratio; and
   an operation control circuit connected to the control value converting circuit and the driver circuit of the motor, wherein the operation control circuit outputs a control signal to the driver circuit according to the control value from the control value converting circuit, and the driver circuit drives the motor to rotate according to the control signal.

* * * * *